United States Patent [19]

Pearce et al.

[11] 4,347,431
[45] Aug. 31, 1982

[54] DIFFUSION FURNACE

[75] Inventors: Charles W. Pearce, Emmaus; Paul F. Schmidt, Allentown, both of Pa.

[73] Assignees: Bell Telephone Laboratories, Inc.; Western Electric Company, Inc., both of New York, N.Y.

[21] Appl. No.: 172,120

[22] Filed: Jul. 25, 1980

[51] Int. Cl.$^3$ .............................................. H05B 3/10
[52] U.S. Cl. .................................... 219/390; 148/189; 373/109
[58] Field of Search ................ 219/390, 553; 422/199, 422/208, 241, 248; 13/20, 31, 24, 25; 118/50, 50.1, 620, 621; 148/189

[56] References Cited

U.S. PATENT DOCUMENTS

| | | | |
|---|---|---|---|
| 2,958,899 | 11/1960 | Stein et al. | |
| 3,180,917 | 4/1965 | Morrison et al. | |
| 3,409,727 | 11/1968 | Hampton | 13/20 |
| 3,598,666 | 8/1971 | Addamiano | 148/189 |
| 3,641,249 | 2/1972 | Higgins | 219/390 |
| 3,698,872 | 10/1972 | Reusser | |
| 3,804,967 | 4/1974 | Werych | 219/390 |
| 4,195,820 | 4/1980 | Berg | 219/390 |

FOREIGN PATENT DOCUMENTS 1466999  3/1977  United Kingdom ................ 219/390

OTHER PUBLICATIONS

Kirk-Othmer Encyclopedia of Chemical Technology, Second Edition, vol. 4, pp. 189-190, 329; 1964.
"A Neutron Activation Analysis Study of the Sources of Transition Group Metal Contamination in the Silicon Device Manufacturing Process", Schmidt, Pearce, Reprint, Journal of the Electrochemical Society, vol. 128, No. 3, Mar. 1981, pp. 630-637.

Primary Examiner—B. A. Reynolds
Assistant Examiner—Bernard Roskoski
Attorney, Agent, or Firm—W. O. Schellin

[57] ABSTRACT

A diffusion furnace (11) includes a typical process tube (12) and an outer envelope (26) which forms an annular chamber (37) with the process tube. A heating element (29) of high purity graphite substantially surrounds the process tube within the chamber (37). Inner surfaces of the chamber (37) are made of materials such as, for example, silicon, pyrolytic graphite or quartz. Such materials are essentially free of harmful impurity elements such as iron, nickel, copper calcium or gold, which have an energy level about halfway between the valence and the conduction band of a semiconductor material to be processed within the process tube. A nonoxidizing gas within the heater chamber protects the graphite elements therein from oxidation. A small gas flow within the chamber (37) is preferred to purge such harmful impurity elements as may penetrate into the chamber during the operation of the furnace.

6 Claims, 2 Drawing Figures

DIFFUSION FURNACE

TECHNICAL FIELD

This invention relates to diffusion furnaces of the type which are typically used in heating operations of semiconductor processes.

BACKGROUND OF THE INVENTION

Semiconductor processes typically include such operations as growing or depositing oxides on wafer surfaces and diffusing impurities such as conductivity type determining dopants into the semiconductor material of the wafers. During such processes semiconductor wafers are heated in furnaces to temperatures which typically range between 700° and 1250° C. At such elevated temperatures thermal migration of atoms proceeds at a sufficient rate to permit such dopants to be diffused into preselected regions of the wafers and form desired functional devices in such wafers.

Semiconductor device characteristics are predictably controlled by the type and concentration of the diffused dopants in such regions of a particular device. Typically, a preselected time-temperature profile in a controlled environment of a furnace brings about a predictable result. However, problems occur in the control of the environment within the diffusion furnaces in that certain harmful impurities tend to be introduced into the furnaces while the furnaces operate at such elevated temperatures. Adverse effects of such harmful impurities show a tendency to increase with time.

A typical prior art furnace is in essence a concentric structure of an inner process tube, a liner, resistance heating elements of, for example, a metallic alloy such as Kanthal, and an outer, insulating support structure. The inner process tube encloses and defines a process chamber into which the wafers are placed. Quartz and silicon are known to possess sufficient structural integrity for a process tube at the temperatures to which the tube is typically subjected.

The liner, of a ceramic material, is typically interposed between the heating elements and the process tube to serve as a guide for centering the process tube and to distribute heat emanating from the heating elements. The heating elements in some furnaces are also supported by such a ceramic structure to add rigidity to the heating elements at these elevated temperatures. The outermost support structure holds the ceramic backup structure in place, to permit a concentric mounting of the process tube, and provides insulation against heat loss from the furnace.

Experience has shown that the process tube in such a prior art furnace needs to be replaced from time to time in an effort to purge the environment within the process chamber of harmful impurities. It appears that as the diffusion furnace is operated, the concentration of the harmful impurities gradually increases in the wall of the process tube and such impurities evaporate from the wall to the wafers which are being processed within the tube. Generally, such harmful impurities are impurity atoms with an energy level between, and most effectively about halfway between the valence and the conduction band of the semiconductor material. The presence of such impurities in the semiconductor base material provides unwanted generation or recombination centers for minority carriers. In many semiconductor device structures the presence of such generation or recombination centers alters the device characteristics in an undesired and frequently unforeseen manner.

In an initial burn-in period of a newly installed process tube an acceptably low level of diffusing harmful impurities becomes established in such tube of a diffusion furnace. During subsequent operations of the furnace the presence of the harmful impurities in the process tube tends to increase with an accompanying diffusion of such impurities into wafers which are processed within the tube. Ultimately, the harmful impurities reach a contamination level at which the process tube is replaced by an unused tube. It is, of course, possible to reduce unwanted characteristics caused by the harmful impurities through known gettering techniques. However, it is more desirable to eliminate the harmful impurities before they reach the wafers.

It also has been noted that the quartz material typically used in the process tubes has a tendency to devitrify. Such a devitrification is not apparent when silicon is used as a material for the process tubes. The devitrification of the quartz tends to shorten the useful life of the process tube, and in some cases it is possible that the tube may have to be replaced even before contamination by harmful impurities reaches an unacceptable level.

However, when a silicon process tube is used in the furnace, contamination by harmful impurities reaches unacceptable levels sooner than when a quartz tube is used under substantially similar conditions.

It is consequently desirable to provide a diffusion furnace with a structure having an increased life cycle over prior art furnaces.

SUMMARY OF THE INVENTION

One of the objects of the present invention is therefore to improve the useful life of diffusion furnaces to minimize costly replacements of process tubes.

According to the invention a diffusion furnace includes a central process tube, and a resistance heater of a high purity graphite material. The heater is located about the process tube. An insulative envelope encloses the process tube and the heater element to redirect heat energy toward the process tube and away from any contaminating environment.

A furnace structure in accordance with the invention is further characterized by a radially outwardly directed temperature gradient which extends from a high temperature at the periphery of a core zone free of harmful impurities toward the outer surface of the envelope where such harmful impurities may be found. An in-diffusion of such impurities against the temperature gradient is thereby minimized.

BRIEF DESCRIPTION OF THE DRAWING

Various advantages and features of the invention are best understood from the following detailed description and the appended drawing, wherein.

DETAILED DESCRIPTION

Figure 1:
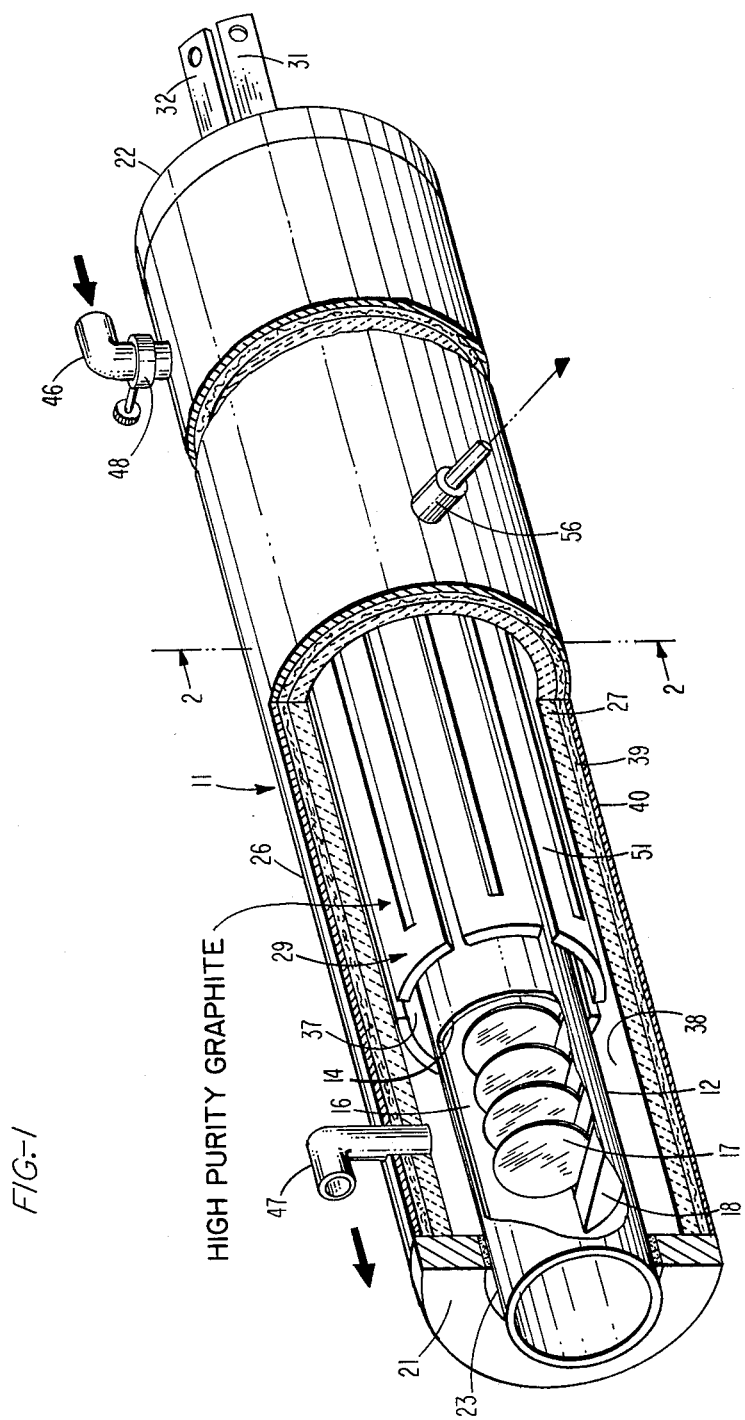
FIG. 1 is a pictorial and partially sectioned view of a diffusion furnace which incorporates features of this invention.

Referring now to FIG. 1, there is shown a diffusion furnace which is designated generally by the numeral 11. In a partially sectioned view of the furnace 11, FIG. 1 reveals a process tube 12 which typically is made of quartz. In the alternative, the tube 12 may be of silicon. The cylindrical space enclosed by a wall 14 of the tube 12 defines a process chamber 16 into which semiconductor wafers 17 held by a typical carrier 18 are inserted for processing.

At least one end of the tube 12 preferably extends through a furnace end plate 21. The end plates 21 and 22 are preferably of a combination of quartz and graphite. At least the one end plate 21 has an opening 23 therein to provide access to the process chamber 16.

The end plates 21 and 22 also abut an outer tubular envelope 26 which is typically spaced from and preferably concentrically located about the process tube 12. The envelope 26 is preferably of a compound structure and includes an inner, heat insulating liner 27 of preferably a high purity pyrolytic graphite material. Supports 28, shown in FIG. 2, which are typically of an insulating material such as quartz, space the process tube 12 from the liner 27 and support heating elements 29 within the space between the process tube 12 and the envelope 26. The precise configuration of the supports 28 is not significant within the scope of the invention. Preferably, the supports 28 for concentrically spacing the process tube 12 within the furnace 11 are separate from the supports 28 for supporting the heating elements 29.

In accordance with this invention, the heating elements 29 are preferably of a graphite material having a degree of purity which is specified by an ash content of less than 100 parts per million. Preferably extending in a direction parallel to the length of the process tube 12, the heating elements 29 are evenly spaced about the wall of the process tube. However, the invention is not based on any particular configuration or route of the heating elements 29, such as one, for example, which would provide more than one separately controllable heat zone along the length of the process tube 12.

Figure 2:
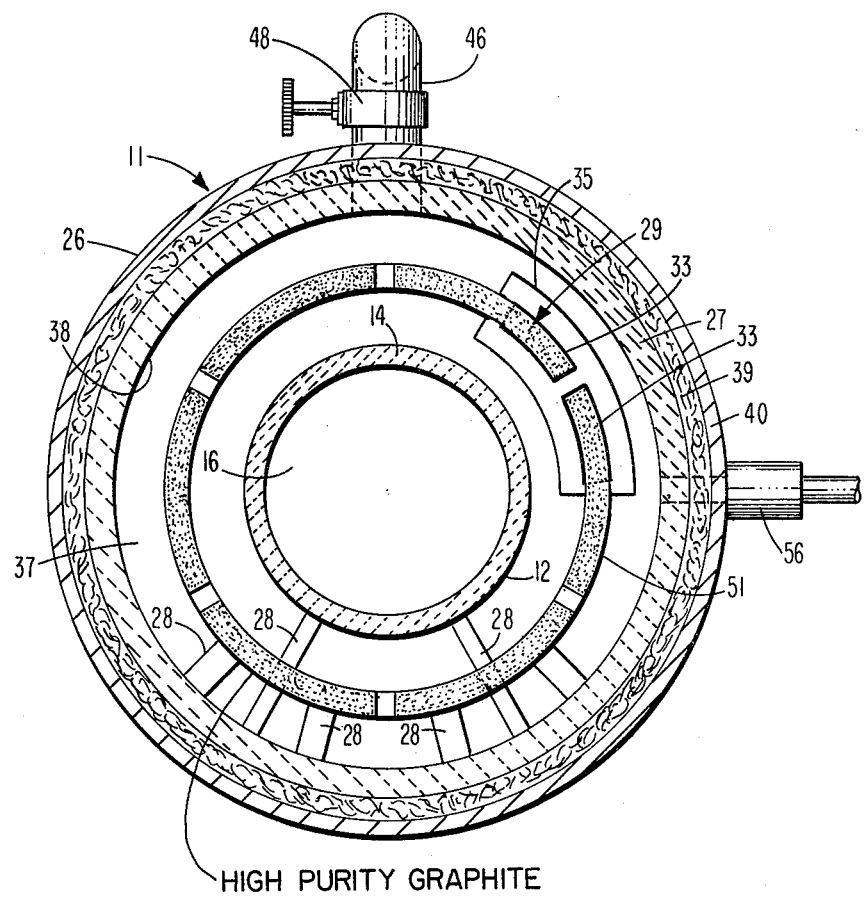
FIG. 2 is a cross-sectional view through the diffusion furnace of FIG. 1, highlighting the relationship of heater elements, an inner process tube and an outer insulative envelope.

The heating elements 29 typically generate heat in the same manner as the metallic heating elements of prior art furnaces in that the heat generated is based on the $I^2R$ loss in the elements. Properly insulated terminals 31 and 32 extend through a convenient portion of the furnace 11, preferably through the end plate 22, to be connected to a suitable power source to electrically heat the furnace 11. FIG. 2 shows a particular embodiment for extending the terminals 31 and 32 through apertures 33 of an insulating quartz insert 35 to protect the adjacent terminals 31 and 32 from becoming electrically shorted through the preferred graphite material of the end plate 22.

While graphite heating elements similar to the elements 29 have been used in high temperature furnaces and crystal growing apparatus, a similar use in diffusion furnaces which typically operate in temperature ranges from 700° C. to 1250° C. is heretofore unknown. Apparent shortcomings of graphite heating elements are their higher cost and their corrosiveness in a heated, and typically oxygen containing environment. Because of such shortcomings the prior art has relied on the use of metallic heating elements in furnaces operating within such temperature ranges which permit the use of such metallic heating elements. In crystal growing apparatus typical temperatures range higher than the melting point of the prior art metal heating elements as they are currently used in diffusion furnaces, and the use of more heat resistant elements such as graphite become a necessity. We now have found that various previously unrealized advantages of certain features of the invention outweigh any shortcomings of the graphite heating elements 29 in the diffusion furnace 11 even though its typical operation is intended to be in a temperature range between 700° C. and 1250° C.

It appears that in typical operations of prior art diffusion furnaces, reactant gases generally are not significant sources of contamination. Instead, gradual contamination of the process tube by harmful impurities has been found to be the result of gradual diffusion and migration of such impurities from sources right within the structure of the furnace itself leading to an eventual replacement of a process tube. The harmful impurities, including for example iron, nickel and calcium are found in the materials which make up the hottest regions of the prior art furnaces. From such hot zones the impurities are driven inwardly along a gradient of decreasing temperature through the walls of the process tubes.

In the prior art furnaces, the metallic heating elements are a major and, for the purpose of causing critical contaminations, an inexhaustible source of iron atoms which appear to be evaporated from the heating elements at operating temperatures of the furnaces. Ceramic type materials which are used for supporting the heating elements and for maintaining temperatures more uniformly are frequently interposed as liners between the heating elements and the process tubes of the furnaces. Typical ceramic materials have been found to contain such harmful impurities as iron, zirconium, sodium, potassium and calcium. Metallic impurities, such as iron, tend to degrade semiconductor junctions by promoting undesirable leakage currents. Alkaline impurities, such as sodium, tend to be equally harmful because the presence of such impurities in oxide layers, particularly in gate oxides of MOS devices, tends to introduce threshold voltage instabilities in such devices. To the extent that such liners frequently are located adjacent to the heating elements, the harmful impurities distributed within the material of such liners find a convenient temperature gradient for a diffusion toward the process tubes.

However, such materials as quartz, graphite or silicon are available without significant concentrations of such harmful impurities. For example, commercially available quartz materials contain in the order of 2 ppm (parts per million) of iron which is about three orders of magnitude less than the concentration of iron in a typical prior art liner material.

What is commonly referred to as high purity graphite is typically specified as having an ash content of no more than 100 parts per million. The carbon becomes volatile as an oxide when a test sample of the material is burned. The remaining ash contains among others calcium, iron, aluminum, silicon, vanadium, titanium, boron and sulfur. Some of the materials such as aluminum and boron are also known as dopant materials and as such are not necessarily detrimental, particularly at low concentrations in which they are present as a source in the graphite of such a purity. Also, silicon is typically the semiconductive element which is being treated in the furnace and, as such, its presence in any concentration is of no consequence at all.

FIG. 2 illustrates particular features of the present invention. A cross section of the diffusion furnace 11 depicts a presently preferred mounting of the heating elements 29 in a spaced position within an annular cavity or heating chamber 37 between the wall 14 of the process tube 12 and an inner surface 38 of the inner liner 27 of the envelope 26. Significantly, the materials of the components which border or, which are located within the chamber 37, such as the wall 14 of the process tube 12, the inner liner 27, the end plate 21 and 22, and the heating elements 29, are of such type which have been ascertained to have low concentrations of the harmful impurities. High purity graphite of a purity having less than 100 ppm ash content is the preferred material for the heating elements 29. However of equal significance to the use of graphite heating elements is the consistent application of graphite in non heating but heated support structures such as the end plates 21 and 22 and the inner liner 27. Quartz, in turn, is preferred as an insulative material of structural elements which come into contact with the current-carrying heating elements 29, such as the supports 28 or the insert 35 of the end plate 23.

It now appears that the use of such materials substantially reduces a devitrification of quartz as a material for the process tube 12. Such a devitrification appears to be the result of a phase change of the quartz which is enhanced by an accumulation of aluminum or sodium in the quartz. The useful life of the process tube is thereby extended. The useful life of the process tube 12 is further extended through a greatly reduced inward migration of the harmful impurities.

The inner surface 38 of the liner 27 may be provided with a reflective finish to focus radiant energy emanating from the heating elements 29 and from the process tube back toward the central axis of the furnace 11. By reflecting radiant heat, the inner liner 27 serves as an active barrier to the contaminating harmful impurities which are typically present in further insulating material 39 and structural supports 40 outside of the liner 27. When the furnace 11 is in operation, a sharp temperature gradient is expected to exist across the inner liner 27 as a non-contaminating barrier between the inner chambers 16 and 37 and the outer supports 40 of the furnace 11.

Retaining the heat within the process chamber 16 not only reduces contaminating migration of harmful impurities toward the process chamber 16, but also reduces the power requirements of the furnace 11. A presently preferred alternative to providing the inner liner 27 with a heat reflective finish surface 38, as it may be done when the inner liner is formed of quartz, is to make the inner liner 27 a graphite radiator. Commercially available graphites can be formed with relatively low heat conductivity. As the inner surface 38 of the liner 27 absorbs heat, its temperature rises, and further absorbed heat is readily re-radiated from the surface 38. Such re-radiated heat is believed to be somewhat more beneficial to the operation of the furnace in that the re-radiated heat appears to be more uniformly distributed than reflected heat which may focus itself in preferred regions of the furnace thereby forming so-called hot spots. By re-radiating the heat from the surface 38 of the liner 27 a more uniformly distributed heat profile impinges on the process tube 12.

Also, an anisotropic pyrolytic graphite is presently commercially available, from example, from Pfizer, Inc. The material is an excellent heat conductor in a first direction and a heat insulator in another direction orthogonal to such first direction. In accordance with the teachings herein, the use of such a material as part of the inner liner offers the possibility of establishing a steep temperature gradient in the liner 27 to serve as a barrier to the inward migration of harmful impurities from, for example, the outer supports 40 of the furnace 11.

Because of the preferred use of graphite in the heated portions of the heater chamber 37, special precaution must be taken to protect the heated graphite components from corrosion. Oxidation of the carbon atoms in the graphite structure forms carbon dioxide which is quickly removed as a gas. A preferred way to protect the graphite structure is to introduce into the heater chamber 37 a nonoxidizing gas such as argon or nitrogen. Nitrogen is preferred because of its ready availability.

An input port 46 connected to a typical supply (not shown) of such gas introduces the gas into the heater chamber 37. An exit port 47 (see FIG. 1) may be vented to a typical exhaust stack (not shown). Excessive removal of heat energy from the furnace 11 is avoided by restricting the gas flow through a throttle valve 48 which may be located, for example, at the input port 46. While it is possible to maintain the atmosphere substantially stagnant within the heater chamber 37, a slow gas exchange is preferred. A continuous gas exchange at a slow flowing rate may have a tendency to purge harmful impurities from the heater chamber 37 without removing a significant amount of energy therefrom. A gas flow rate which tends to exchange the atmosphere within the chamber approximately once per minute is considered to be satisfactory, however other flow rates may be chosen within the scope of the invention. Such a continuous purge of the heater chamber 37 reduces the possibility that any such unwanted impurities, which may have found their way through the outer supports 40 into the heater chamber, contact the process tube 12 and migrate through its wall 14 into the process chamber 16. The purging flow of gas consequently further contributes to maintaining a clean environment of the process chamber 16. An alternate embodiment to the introduction of a nonoxidizing atmosphere includes, for example, forming a protective surface layer of silicon carbide over all graphite surfaces. However, cracks in such surface layer may introduce corrosion during operation of the furnace.

The heating elements 29 preferably extend longitudinally through the heater chamber 37 in peripheral serpentine segments 51. The resulting configuration may be manufactured by presently known techniques and permits the electrical terminals 31 and 32, of the elements 29 to protrude through the end plate 22 or, more particularly, through the insulating insert 35. Such an external termination serves to eliminate metallic terminations from the space within the heater chamber 37. The external terminals 31 and 32, to the extent that they constitute heatable portions of the segments 51, may be protected in any of a number of ways such as, for example, coating major portions thereof with a silicon carbide or protecting the terminals with a similar protective atmosphere as within the chamber 37.

Also, it should be realized from the above description that the advantages of the invention are obtained from the structure of the heater chamber 37. Thus it is not intended to alter any of the conventional process and apparatus by which reactive gases are typically introduced into the process chamber 16 itself. It is intended that the furnace 11 is equipped with the desired typical tubes and connections (not shown) to supply any desired reactive gases to the process chamber 16 in a typical manner. Such tubes may be connected to one or both ends of the process tube 12 to permit such gases to flow the length of the tube in reactive contact with the wafers 17 therein.

Recently, furnaces have become commercially available which introduce steam under high pressure into a process chamber for an oxidation process at relatively lower temperatures. The respective process chamber is totally contained within an outer envelope and the outer envelope is pressurized with nitrogen to relieve the stress on the process tube. The present invention could be applied to such a pressurized diffusion furnace by extending the envelope 26 such that the process tube 12 is totally located within the chamber 37.

Also, in a further step to provide a non-contaminating environment within the furnace 11, conventional thermocouples which typically are used for monitoring and controlling temperatures within the furnace 11, may be replaced by commercial pyrometers 56, which may be mounted to the outer structural supports 40 as shown in FIG. 2. The optics of the pyrometer are preferably focused on the wall 14 of the process tube 16. Since the use of such pyrometers 56 eliminates another possible source of contamination a further advantage may be derived from such modification.

Other changes and alterations can be made to the described furnace 11 without departing from the spirit and scope of this invention.

What is claimed is:

1. A diffusion furnace which comprises:
   a central process tube of a material taken from the group of silicon and quartz;
   a resistance heating element of a high purity graphite material having an ash content of no more than 100 parts per million, said element being disposed about said process tube; and
   an insulative envelope substantially enclosing the process tube and forming with said process tube an annular heater chamber for housing the heating element, said envelope having an inner wall of a material taken from the group of high purity graphite having an ash content of no more than 100 parts per million and quartz, such that the combination of the heating element and said envelope and process tube are capable of heating the space within said process tube to a temperature range including temperatures of 700° C. and 1250° C. substantially without contaminating transfer of undesirable impurities from such heater chamber toward the space within the process tube.

2. A diffusion furnace according to claim 1, wherein the inner wall of the insulative envelope comprises an inner liner of high purity graphite, said inner liner being bounded by end plates, said end plates being formed at least partially of high purity graphite, at least one of said end plates having electrically insulative portions including openings for receiving terminals of the heating element.

3. A diffusion furnace according to claim 1, wherein said inner wall comprises an inner liner with a reflective surface finish for redirecting heat energy emanating from the heating element and from the process tube toward the process tube and away from any contaminating environment external to such insulative envelope, said furnace further including insulative end plates, said end plates being mounted in contact with said diffusion tube and said envelope to substantially seal an ambient atmosphere from the annular heater chamber.

4. A diffusion furnace according to claim 3, further comprising means for introducing a nonreactive gas into the heater chamber.

5. A diffusion furnace according to claim 3, further comprising means for establishing a purging gas flow through the heater chamber.

6. A diffusion furnace according to claim 1, wherein the envelope comprises an inner liner, said inner liner being substantially free of harmful impurities having energy levels between the valence and the conduction band of a semiconductor material to be processed in the process tube, wherein the annular heater chamber is substantially sealed from an ambient atmosphere and is capable of becoming substantially occupied by a nonoxidizing gas under at least ambient pressure, and wherein materials of structural elements which are subject to becoming exposed to such gas occupying the annular heater chamber are substantially free of such harmful impurities.

* * * * *